United States Patent [19]

Hendrickson

[11] 4,148,047
[45] Apr. 3, 1979

[54] SEMICONDUCTOR APPARATUS

[75] Inventor: Thomas E. Hendrickson, Wayzata, Minn.

[73] Assignee: Honeywell Inc., Minneapolis, Minn.

[21] Appl. No.: 869,981

[22] Filed: Jan. 16, 1978

[51] Int. Cl.² .......................................... H01L 29/72
[52] U.S. Cl. ........................................ 357/23; 357/22; 357/41; 357/42; 357/45
[58] Field of Search ....................... 357/22, 23, 41, 42, 357/45

[56] References Cited

U.S. PATENT DOCUMENTS

| 3,783,349 | 1/1974 | Beasom | 357/23 |
| 4,015,278 | 3/1977 | Fukuta | 357/22 |

Primary Examiner—Edward J. Wojciechowicz
Attorney, Agent, or Firm—Theodore F. Neils

[57] ABSTRACT

A field-effect transistor device is provided having a relatively low "on" condition resistance between the source and drain terminals thereof by virtue of the geometrical design used.

65 Claims, 18 Drawing Figures

FIG.1C
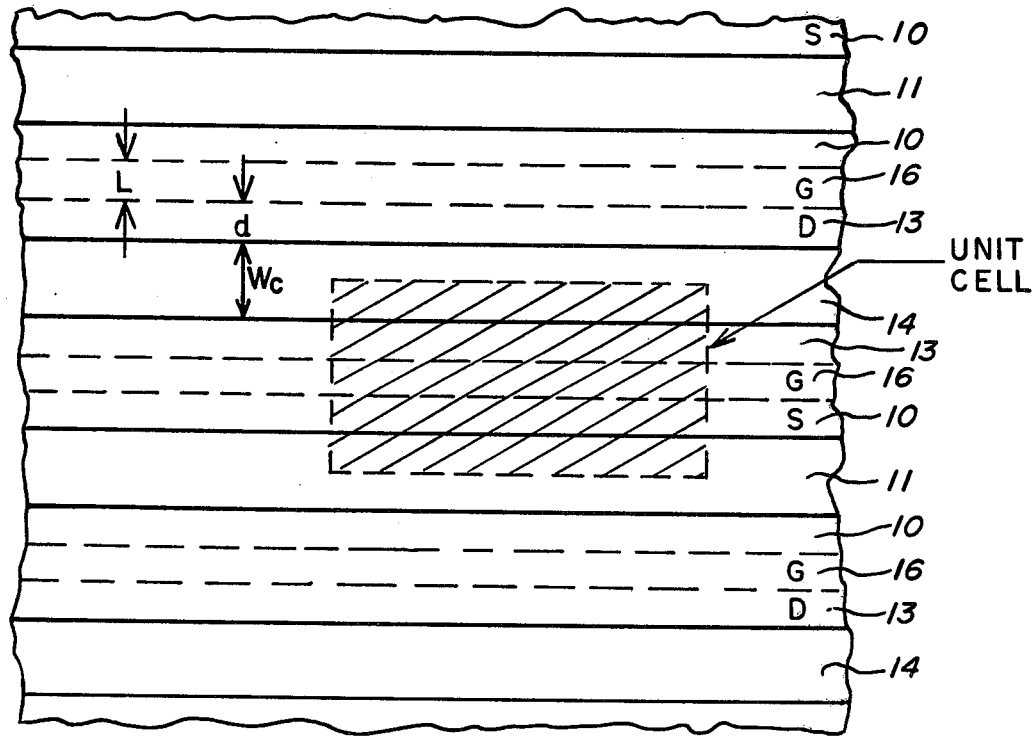
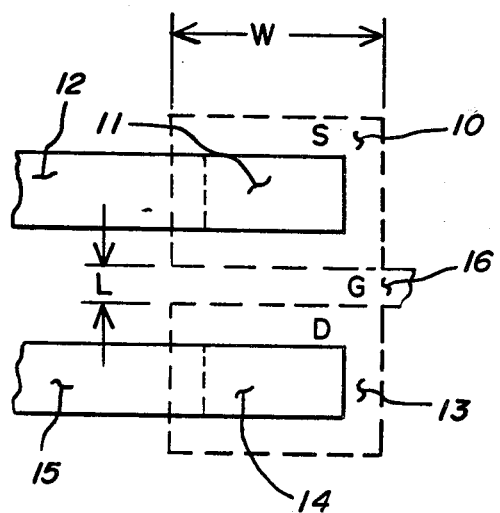
FIG.1A
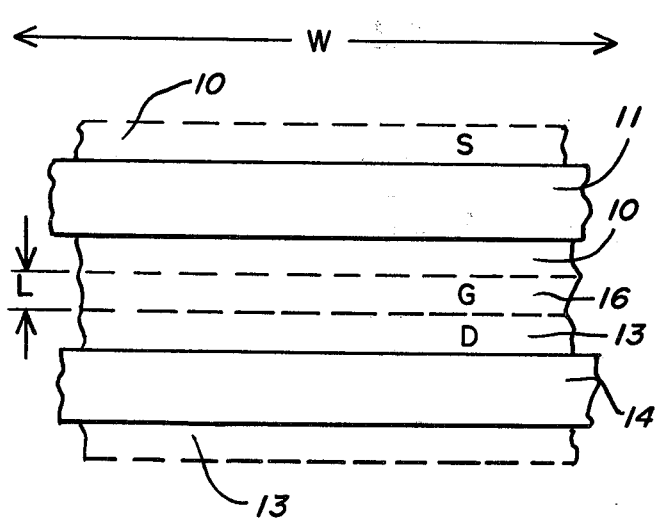
FIG.1B

SEMICONDUCTOR APPARATUS

REFERENCE TO CO-PENDING APPLICATIONS

Reference is hereby made to co-pending applications by J. M. Daughton and T. E. Hendrickson entitled "Semiconductor Apparatus" having Ser. No. 869,980 and by T. E. Hendrickson and J. S. T. Huang entitled "Semiconductor Apparatus" having Ser. No. 869,977, which were both filed on even date with the present application and which are both assigned to same assignee as the present application. Both co-pending applications disclose to some extent but do not claim the semiconductor devices which are specifically disclosed and claimed in the present application.

BACKGROUND OF THE INVENTION

The present invention is related to field-effect transistor devices for electrical signal control and switching, particularly analog signals, and more particularly, to the geometry and other material proper ties of the field-effect transistor device design for a field-effect transistor device analog signal switch.

The field-effect transistor has certain attributes which are attractive for analog signal switching. The first of these is that a field-effect transistor can be a bilateral device so that, for AC signal switching, the field-effect transistor appears to have the same output characteristics whatever the voltage polarities are at which the designated source and drain regions in the device happened to be operated at during any point in an AC voltage cycle. Further, there is no offset voltage in the source-drain volt-ampere characteristics of a common source operated field-effect transistor as there is in the collector voltmapere characteristic of a common emitter operated bipolar transistor.

A problem with the field-effect transistor for use as an analog signal switch exists, however, in that the "on" condition resistance between the drain and source of the field-effect transistor is typically quite a bit higher than that experienced, for instance, in the output of a bipolar transistor. Such an "on" condition drain-to-source resistance, or channel resistance, has deleterious effects on switching operations. First, this resistance increases the power dissipation occurring in the switch when in the "on" condition, a situation which is particularly troublesome if the field-effect transistor device is to be used as a power device carrying substantial currents in the "on" condition. Secondly, this "on" condition resistance slows the switching speed of the field-effect transistor-load combination limiting the usefulness of the switch for controlling rapidly changing analog signals.

For field-effect transistors formed in a semiconductor body, such as in FIG. 1A, the "on" condition drain-to-source resistance has been found to depend upon various material parameters of the materials used in the construction thereof, and upon the dimensions thereof; in the latter instance, particularly, upon the effective width and length of the field-effect transistor device in the semiconductor material used. That is, the "on" condition channel resistance is dependent upon the effective length of the channel between the sources and drains therein, and upon the effective width of the channel between sources and drains therein facing one another across the channel. The following relationship has been found:

$$R_{on} \propto L/w.$$

As is also known, the "punch-through" voltage and the device switching time device parameters are each determined substantially by the channel length, L, with both decreasing with decreasing L. Thus, one might conclude that channel length L in the stripe geometry transistor of FIG. 1A should be made as small as practically possible while increasing the channel width, w, to the extent necessary to achieve a satisfactorily small $R_{on}$. That is, one might keep the channel length as short as possible, consistent with the design layout rules required by the fabrication process and with the need to maintain an adequate punch-through voltage minimum for operation in the "off" condition, and then extend the channel width until a satisfactory "on" condition drain-to-source resistance is achieved. The result of this design criteria is suggested in FIG. 1B.

In FIGS. 1A and 1B, the source region, 10, is formed beneath, but intersecting, a planar major surface of a semiconductor material body, this surface supporting an insulating layer thereover. The source region is also marked by S. A cut or opening, 11, in the insulating layer is shown to accommodate an electrical contact to source 10, and this contact is shown made by an external interconnection means, 12, in FIG. 1A. There need not be an external connector, however, as source region 10 may be extended to other regions in the semiconductor material body to thereby provide its own interconnection. No such external interconnection is shown in FIG. 1B where source 10 is indicated to extend indefinitely until some value of w is reached which provides a suitably small "on" condition channel resistance. Again, however, between solid lines, region 11 is shown in FIG. 1B to accommodate an external interconnection means.

A drain region, 13, is shown in FIGS. 1A and 1B and marked with a D. Again, a cut or opening, 14, is shown for providing a connection to source 13 via this opening by an external interconnection means, 15, by way of example. In FIG. 1B, again the drain region 13 shown to extend indefinitely until a satisfactory w dimension is reached to provide a sufficiently small $R_{on}$.

FIGS. 1A and 1B each have a gate structure, 16, between source region 10 and drain region 13. Structure 16 may either be a gate conductor for a MOSFET, separated therefrom by an insulating layer, or structure 16 may be part of an interconnection means for electrically connecting to the gate region provided in a JFET.

Thus, FIG. 1B represents a possible method for increasing the channel width w to the extent necessary to reduce the "on" condition channel resistance. However, the efficacy of such a structure must be questioned for use as an analog signal switch because the long gate leads, and perhaps the source and drain leads, introduce added resistance which has a negative effect on the switching time and which increases power dissipation. Further, such a structure will take up area in a major surface when formed in a monolithic integrated circuit with no indication that the area is being consumed optimally.

Using up such area in a major surface of a monolithic integrated circuit is an expensive proposition. Experience has shown that the yield of operable integrated circuit chips from the fabrication process for a given monolithic integrated circuit is inversely proporational to the area of the major surface taken up by that monolithic integrated circuit. The cost, then, for a good monolithic integrated circuit chip is inversely proportional to the number of such chips formed in a wafer times the yield, with the result that the cost becomes proportional to the square of the area taken up in the major surface of the monolithic integrated circuit chip.

Thus, when considering the production of a monolithic integrated circuit chip, there is an extreme importance attached to the minimizing of the area of the major surface required therein. For field-effect transistor devices fabricated at a major surface of a monolithic integrated circuit, the minimization of the area of this major surface devoted to such field-effect transistor devices, for a given "on" channel resistance, is equivalent to minimization of the "on" condition channel resistance-device area product ($R_{on}A$). This is because the $R_{on}A$ product ultimately determines the size of the monolithic integrated circuit chip major surface required to accommodate such field-effect transistor devices. Minimizing the field-effect device surface area used for a given "on" condition channel resistance also serves to minimize the gate area over the channel region, which improves switching speed by reducing both gate means resistance and the capacitances associated therewith.

FIG. 1C shows an alternative way to effectively increase the channel width while maintaining the channel length as small as possible. That is, rather than having a single long source, a single long drain, and a single long gate, there are provided multiple sources, drains, and gates repeated in a stripe effect pattern. This essentially represents dividing the structure of FIG. 1B several times and placing the resulting portions side by side.

Another geometrical layout which seeks to further reduce the $R_{on}A$ product beyond that reduction achieved by the structure of FIG. 1C is shown in U.S. Pat. No. 3,783,349 to Beasom. The Beasom reference discloses arranging rectangular or square source and drain regions in a semiconductor material body, separated by surfaces in the body major surface associated with gate portions, to form a grid or rectangular mesh arrangement having the sources and drain regions along intersections or centers of a grid pattern formed by sets of perpendicular lines. A portion of the essence of the pattern in the Beasom reference is repeated in FIG. 2 herein.

Source regions intersecting the surface of the semiconductor material body in FIG. 2 are again marked with S and by the numeral 10. The drain regions on the semiconductor material body are again marked with D and by the numeral 13. The portions of FIG. 2 associated with the gate regions are again marked with the letter G and by the numeral 16. Once again, the device of FIG. 2 is assumed to have an insulating layer over a semiconductor material body leading to the source and drain regions being shown in dashed lines. No interconnection means for the sources and drains are shown. Those portions of the source and drain regions which electrical contact would be made are shown by the solid line openings which are again marked by the numerals 11 and 14.

A further design geometry for this purpose is shown in U.S. Pat. No. 4,015,278 to Fukuta. In this situation, the sources are shown in the geometrical form of a letter "Y" while the drains are shown in geometrical form of a hexagon.

These alternative geometrical designs for field-effect transistors do indeed appear to aide in reducing the $R_{on}A$ product from the initially shown geometrical design layouts of FIGS. 1A and 1B for the various layout criteria. However, further improvements in the reduction of the $R_{on}A$ product are most desireable, especially where the field-effect transistor device is to be formed in a monolithic integrated circuit and be capable of controlling substantial currents therethrough without overheating the monolithic integrated circuit chip.

SUMMARY OF THE INVENTION

A field-effect transistor device is provided wherein the portions thereof involved in the gate region separate triangular areas formed in a densely packed hexagonal matrix structure. Several kinds of field-effect transistor devices and structures therefor can be so provided.

BRIEF DESCRIPTION OF THE DRAWINGS

FIGS. 1A and 1B and 1C show field-effect transistor device source, drain and gate geometrical arrangements known in the prior art.

DESCRIPTION OF THE PREFERRED EMBODIMENTS

Figure 2:
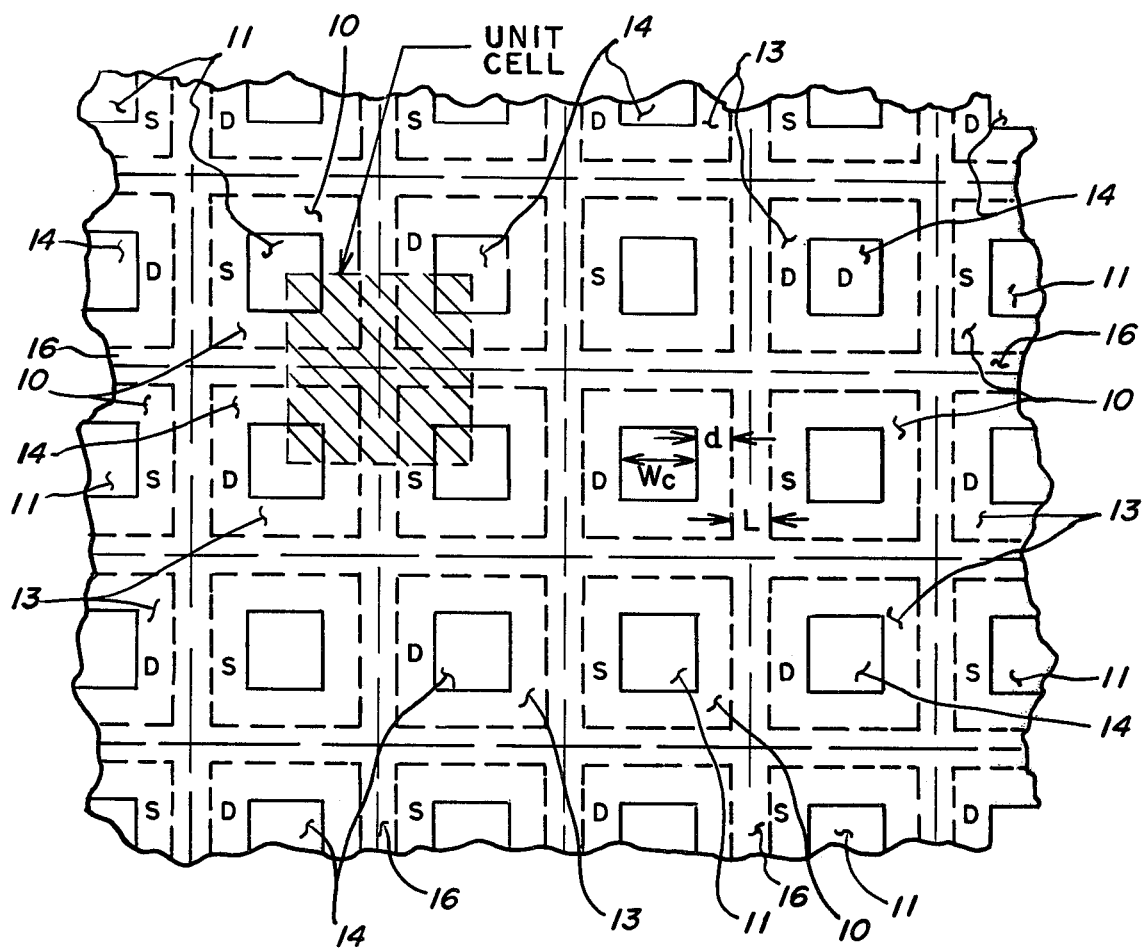
FIG. 2 shows a field-effect transistor device source, drain and gate geometrical arrangement known in the prior art.

The effect of the geometrical arrangement in the present invention of the source and drain regions in a field-effect transistor device for the purpose of decreasing the characterizing $R_{on}A$ product below that achieved in prior art structures can be shown by a mathematical model representing possible geometrical arrangements generally. Then, manipulation of that model may permit finding better geometrical arrangements. Understanding and attacking the problem of field-effect transistor device design for devices suitable for handling substantial power in a monolithic integrated circuit, or other small structure, in this manner does not appear to have occurred in the prior art so the results are not found there either.

The problem of minimization of the $R_{on}A$ product of a surface field-effect transistor device has been found to be directly analogous to the problem of densely packing two-dimensional figures on a plane. This is so because the surface field-effect transistor device formed at the major surface of a semiconductor material body is essentially a two-dimensional device. That is, given a specific "on" condition channel resistance which must not be exceeded, minimize the area taken up by the geometrical arrangement of the field-effect transistor device in the major planer surface of the semiconductor material body containing the device.

The value of the effective channel length L, as earlier indicated, is to be kept as small as possible for reasons of aiding in minimizing both switching speed and "on" condition channel resistance minimization. The value of L finally chosen is, of course, subject to the construction of satisfying the design layout rules with regard to minimum spacings, as required by the process used to fabricate the field-effect transistor device, and of satisfying the minimum punch-through voltage requirement for the transistor when operated in the "off" condition. Thus, the value of L is not subject to being varied for the purposes of reducing device area leaving, as earlier indicated, the effective channel width w to be varied for these purposes. In these circumstances, the problem of minimizing the $R_{on}A$ product for the device can be restated as selecting the effective channel width w dimension necessary to obtain a satisfactorily small "on" condition channel resistance, and then minimizing the area of the resulting field-effect transistor device. Of course, the effective channel width w is subject to the same fabrication process dictated design layout rules mentioned in connection with channel length.

The layout shown in FIGS. 1A, B, and C is based on only the lowest order two-dimensional point symmetry group in the group theory of two-dimensional lattice geometrical figures. The geometrical arrangement shown in FIG. 2 makes use of a higher order point symmetry group, four-fold rotational symmetry.

However, from group theory, the problem above has as solutions the point groups 2, 4mm, 6mm, and 2mm (i.e., geomtrical figures possessing rotational symmetries of one-, two-, three-, four-, and six-fold). Since surface related field-effect transistor devices inherently possess a two-fold symmetry themselves, only those groups which can be decomposed into a two-fold and n-fold axis are actual solutions of the problem. Thus, not only are layouts possessing two-fold and four-fold rotational symmetry satisfactory solutions to the problem, but also layouts possessing six-fold rotational symmetry represent proper, densely packed device arrangement solutions. In practice, since one layer of metal must have a two-fold or lower symmetry, these layouts must be implemented with rectangles for the four-fold symmetry case, as shown for a device portion in FIG. 2, or with triangles for the six-fold symmetry case, a portion of which is shown in FIG. 3A.

The device portion shown in FIG. 3A again has source and drain regions, shown by dashed lines, formed in a semiconductor material body and intersecting a major surface thereof which surface supports an insulating layer. The intersections in the major surface of the source and drain regions provide densely packed triangular surface portions in the major surface. The triangular surface portions are shown as equilateral triangles which are preferred though not necessary. FIG. 3A again has the source regions 10 marked with an S. Drain regions 13 are again marked with a D, and finally, the gate regions 16 are again marked with a G. Smaller solid line triangles are shown where electrical contact would be made to the source and drain regions by the source interconnection means and the drain interconnection means, respectively.

Figure 3A:
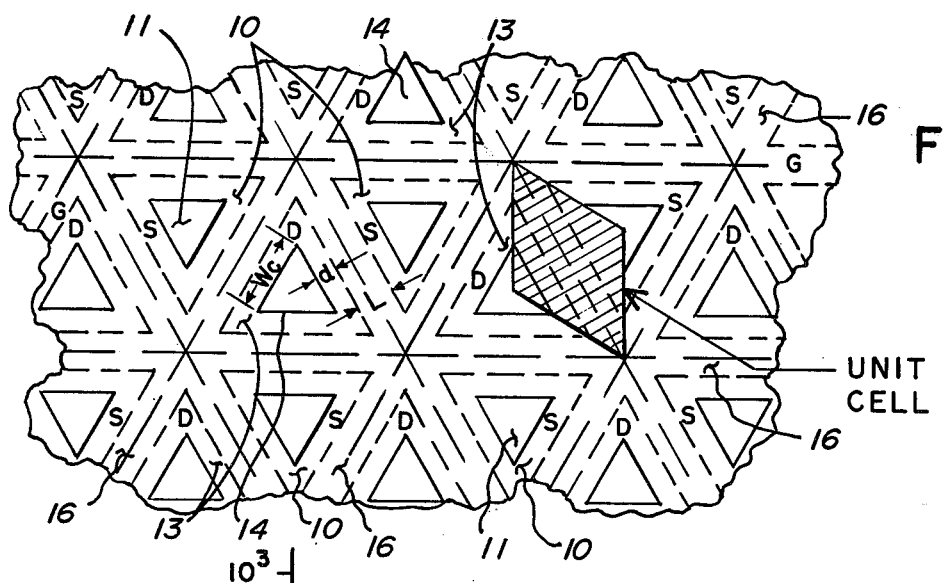
FIGS. 3a, 3b and 3c shows various shows field-effect transistor device source, drain and gate geometrical arrangements of the present invention.

The long dashed lines along the separating surfaces between the source and drain triangular surface portions, forming the mesh network in the triangular mesh associated with the gate in FIG. 3A, provide extended triangles around each of the triangular surface portions representing a source or a drain. These extended triangles include an associated part of the gate mesh with each source and drain triangular surface portion. When these larger triangular surface portions are considered in relation to one another, the extended triangles (shown here as equilateral triangles just as are the triangular surface portions of the source and drain regions) make clear the six-fold rotational symmetry in forming a densely packed hexagonal matrix structure. Similarly, long dashed lines have been added in FIG. 2 to form extended quadrilateral surfaces, actually squares, in the rectangular mesh, or square mesh, shown there. These larger square portions make clear the four-fold rotational symmetry in forming a densely packed rectangular matrix structure.

To determine the relative merits of the various layouts possible within the bounds of the group theoretical solutions indicated above, the RA product must be evaluated for each. To do so, the assumption is made that each field-effect transistor device associated with an evaluated layout will be operating in the linear region at small values of drain to source voltage, $V_{DS}$. The well-known equation for the "on" condition channel resistance for a MOSFET, as an example, is given by the following expression:

$$R_{on} = \frac{L_{eff}}{w_{eff}\mu C_{ox}(V_{GS} - V_T)}$$

The meanings of the symbols used in the foregoing equation are the following:

$R_{on}$ ≜ "on" condition channel resistance.

L ≜ channel length.

$W_{eff}$ ≜ effective channel width.

$C_{ox}$ ≜ capacitance per unit area of gate-oxide capacitor.

$\mu$ ≜ mobility of channel carriers.

$V_{GS}$ ≜ gate to source voltage.

$V_T$ ≜ threshold voltage.

To proceed with the analysis, the $R_{on}A$ product is now found by first substituting for $w_{eff}$ in the foregoing equation, the value obtained therefor from the unit cell in each of the layouts shown in FIGS. 1C, 2, and 3A which, represent the layout solutions found within the bounds of the group theory set out above. The unit cells in these three figures each represent the associated minimum dimension basic cell for each of the layouts therein, respectively, as determined by the group theory used. Finding the $R_{on}A$ product for the layout in each of FIGS. 1C, 2, and 3 is then completed by multiplying the associated version of the foregoing equation—now containing the appropriate substitution for $w_{eff}$—by the area of the corresponding unit cell.

The following equations are obtained for the geometrical arrangements shown in FIGS. 1C, 2, and 3A:

$$(R_{on}A)_{FIG.\ 1C} = \frac{L\ (L + w_c + 2d)}{\mu C_{ox}\ (V_{GS} - V_T)}$$

$$(R_{on}A)_{FIG.\ 2} = \frac{L\ (L + w_c + 2d)^2}{\mu C_{ox}\ 2\ (w_c + 2d)\ (V_{GS} - V_T)}$$

$$(R_{on}A)_{FIG.\ 3A} = \frac{2(3)^{\frac{1}{2}}L\ [\frac{w_c}{2(3)^{\frac{1}{2}}} + d + \frac{L}{2}]^2}{\mu C_{ox}\ [w_c + 2(3)^{\frac{1}{2}}d]\ (V_{GS} - V_T)}$$

In these equations, $w_c$ represents the width of the electrical contact made by the interconnection means to each of the source and drain region major surface portions, while d represents the minimum required spacing between the electrical contacts and the edge of the channel in each of the source and drain region major surface portions.

The meaning of the last three equations resulting for the $R_{on}A$ products of the layouts in FIGS. 1C, 2, and 3A can be seen by comparing the equation values when a defined parameter representing the effective channel width per source or drain region, ($w_c$ + 2d), is varied with respect to the effective channel length L. In the limit where the channel width parameter is much greater than the channel length, i.e. ($w_c$ + 2d)>>L, the $R_{on}A$ product representing the perpendicular lines-of-centers grid of FIG. 2, $(R_{on}A)_{FIG.\ 2}$, approaches being one half of the $R_{on}A$ product for the repeated stripe geometry of FIG. 1C, $(R_{on}A)_{FIG.\ 1C}$ for identical values of $w_c$, d, and L. On the other hand, the $R_{on}A$ product for the triangular mesh of FIG. 3A, $(R_{on}A)_{FIG.\ 3A}$, shows the improvement achieved by the present invention in being but a third of that for the repeated stripe layout geometry of FIG. 1C. To restate, the following results are obtained in the desired situation of using as short as possible channel lengths:

$$(R_{on}A)_{FIG.\ 2} \rightarrow 0.50(R_{on}A)_{FIG.\ 1C},\ (w_c + 2d)>>L$$

$$(R_{on}A)_{FIG.\ 3} \rightarrow 0.33(R_{on}A)_{FIG.\ 1C},\ (w_c + 2d)>>L$$

For the same equations, when ($w_c$ + 2d) is approximately equal to L, the RA products for all three of the layouts of FIGS. 1C, 2, and 3A are nearly equal. Finally, when ($w_c$ + 2d) is much less than L., the layout of FIG. 1 turns out to have the lowest $R_{on}A$ product.

Figure 4:
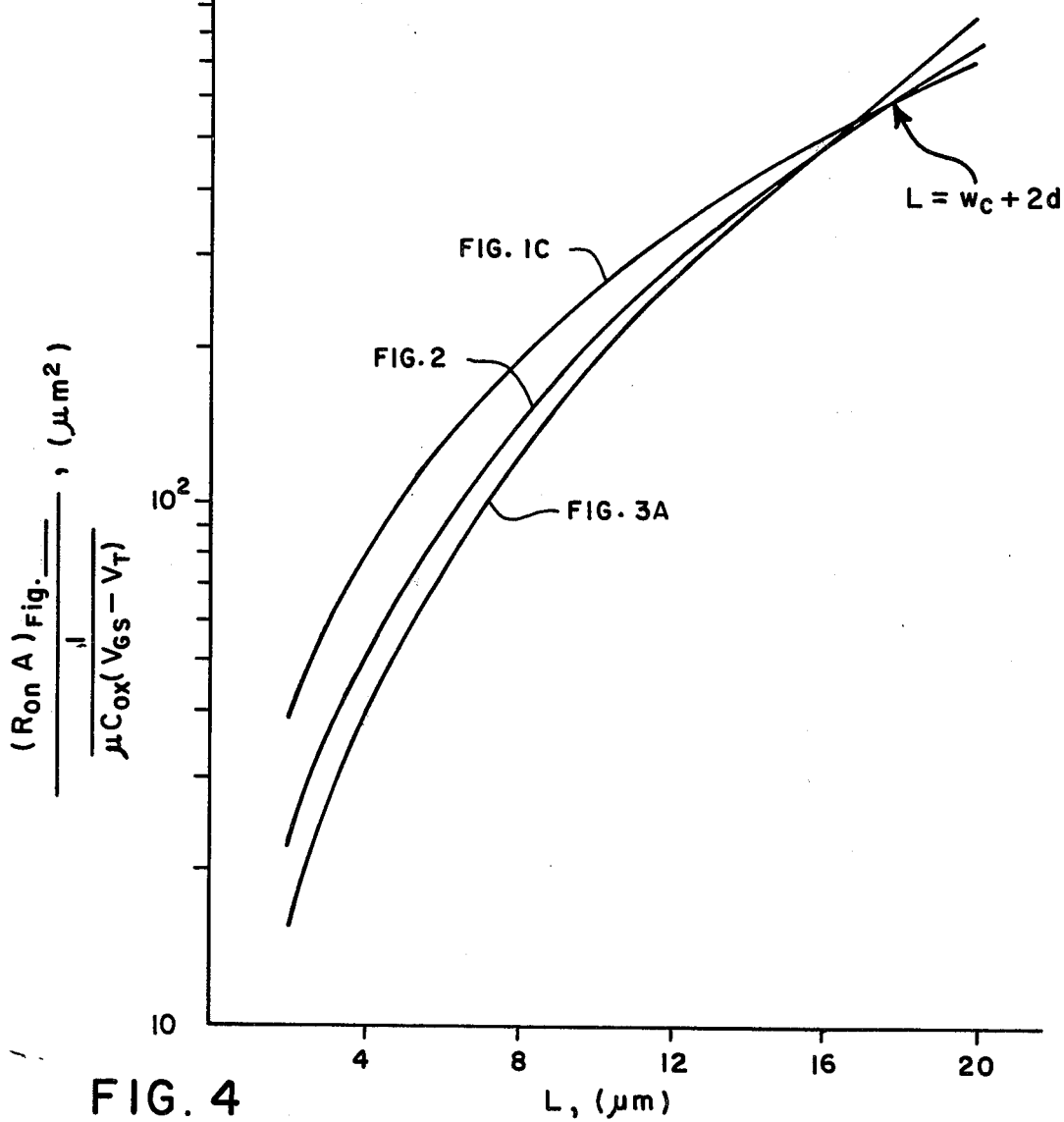
FIG. 4 shows a graph of the "on" condition channel resistance-device area product versus channel length for three field-effect transistor device source, drain and gate geometrical arrangements.

This relationship is shown by the graph in FIG. 4 where the $R_{on}A$ product for each of the layouts in FIGS. 1C, 2, and 3A are plotted as a function of channel length L. The $R_{on}A$ product has been normalized by the factor $\mu C_{ox}$ ($V_{GS}$-$V_T$) and the assumption has been made that the layout rules permit $w_c$ = 5$\mu$m and d = 6$\mu$m. The result shown by these equations in FIG. 4 is that the triangular mesh, i.e. the densely packed hexagonal matrix structure of FIG. 3A, has the smaller $R_{on}A$ product when the channel length becomes relatively small, a situation indicated above to be most desirable. That is, of course, achieved with the size of the source and drain regions having been chosen no more than reasonably large enough to meet the limitations in the fabrication process typically used in manufacturing monolithic integrated circuits.

Of course, since monolithic integrated circuit layout rules for minimum spacings will tend to dictate the relative minimum size of each unit cell for each of the layouts in FIGS. 1C, 2, and 3A, practical layouts may not be able to achieve the full potential reduction in the RA product for a given one of these symmetry group solutions to the minimization problem above. Thus, there is a possibility, for instance, that the four-fold symmetry group represented in the FIG. 2 layout might possess a lower $R_{on}A$ product in practice than does the six-fold symmetry group structure represented in FIG. 3A, even for a relatively small channel length, despite the relationships of FIG. 4. Thus, necessarily, any relative result among the foregoing solutions must be examined by a simulated or an actual test structure before choosing among them.

For instance, the foregoing analysis of the FIGS. 1C, 2, and 3A arrangements has proceeded on the assumption that, in each instance, the interconnection means for electrically interconnecting the source and drain regions can be ignored in the analysis. If this is not the case, possibly because the minimum spacing rules might require, for one layout as opposed by the others, an interconnection means, having relatively thin leads therein leading to a relatively high interconnection means resistance. Then the relative merits of two layouts, such as the FIGS. 2 and 3A layouts, might be just reversed from that concluded in the above analysis. However, in both theory and practice, the triangular mesh layout of FIG. 3A has proved to have a smaller surface area in the monolithic integrated circuit for a given "on" condition channel resistance than does the perpendicular lines-of-center grid layout of FIG. 2. In fact, the interconnection means resistance can even be relatively lower in the triangular mesh layout of FIG. 3A than in the perpendicular lines-of-center grid layout of FIG. 2.

Figure 5:
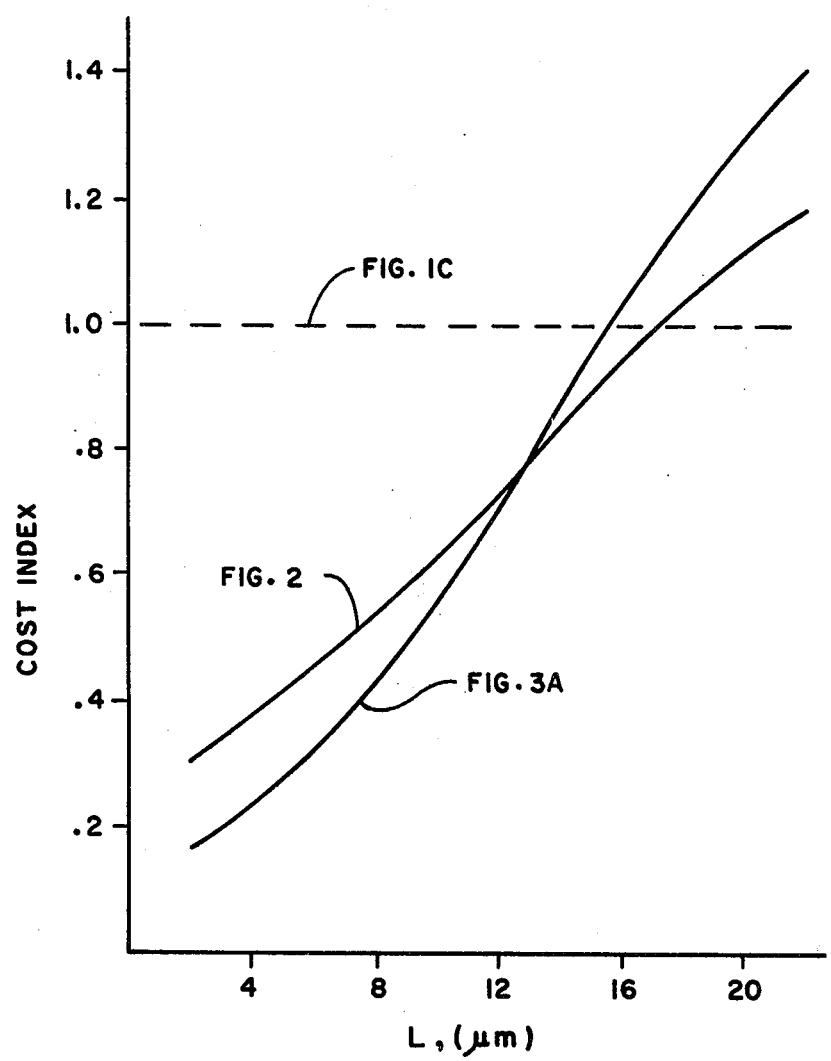
FIG. 5 shows a graph of estimated relative costs of three field-effect transistor device source, drain and gate geometrical arrangements.

Earlier, the relationship was noted that cost was typically proportional to the square of the area taken up in the major surface in a monolithic integrated circuit. FIG. 5 shows a plot of relative costs in terms of indices, the plot being made on the basis of the repeated stripe layout of FIG. 1C being the base cost. Note that the selection of the least cost layout clearly depends on the channel length chosen in connection with a particular layout for fixed values of $w_c$ and d. For a channel length of 7.5 $\mu$m, the perpendicular lines-of-centers grid of FIG. 2 can be expected to cost approximately 50% of the cost of the repeated stripe layout of FIG. 1C while the triangular mesh layout would be expected to cost but 37% of the FIG. 1C layout. Again, these costs assume that analysis used in the above equations is not compromised in practice by layout rules leading to relatively high resistance interconnection paths for one layout as opposed to the other.

Figure 3B:
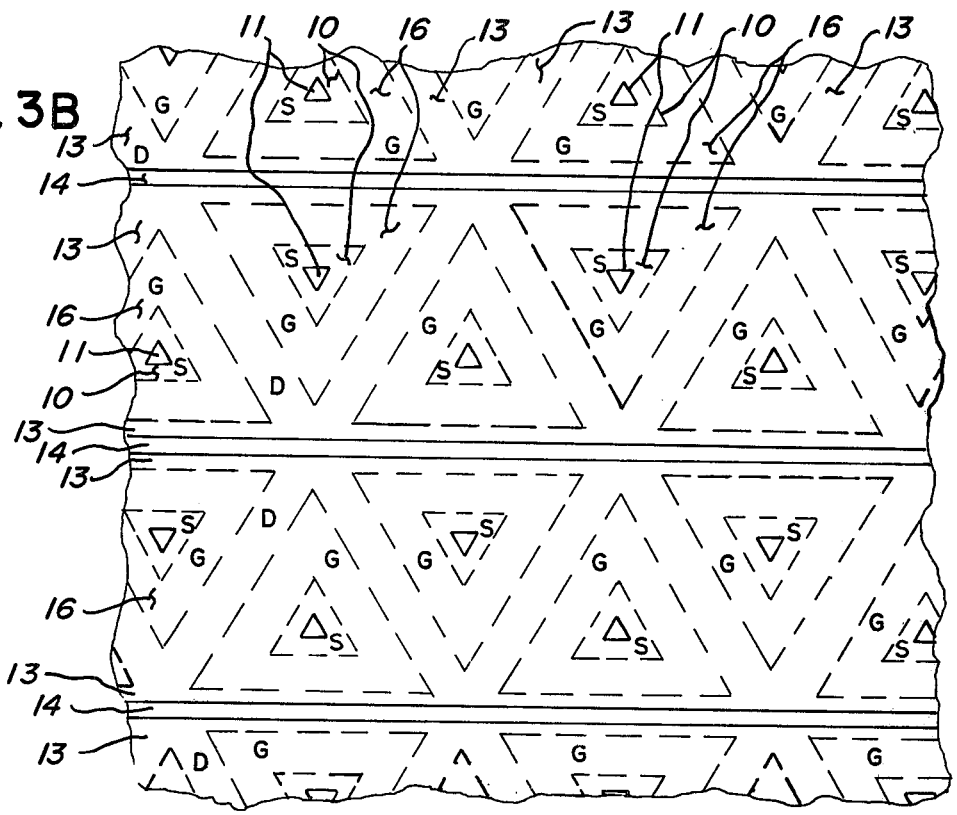

An alternate field-effect transistor device, also based on use of a densely packed hexagonal matrix structure, is shown in FIG. 3B. This version can also provide a both low "on" condition channel resistance and a low resistance in the metallization runs of the source and drain interconnection means, respectively. Further, the metallization shown in FIG. 3B can be provided in the pattern shown more easily than the pattern for the version shown in FIG. 3A in at least some metallization processes.

In the arrangement of FIG. 3B, the source region triangular surface portions 10 are within, and coincide with, the triangular gate surface portions 16. The drain region mesh surface portions 13 form a mesh pattern having triangular openings wherein the source and gate region surface portions are contained. Thus, latter regions are densely packed in a hexagonal matrix structure in the surface of the device shown in FIG. 3B, where the regions just mentioned are provided below a passivating layer covering the device.

FIG. 3B has source regions 10 again marked with a S and drain region 13 again marked with a D. Finally, gate regions 16 are again marked with a G. The solid line, and smallest, triangles represent openings in the insulating layer where electrical contact would be made to source regions 10 by the source interconnection means. The parallel solid lines define openings in the insulating layer where electrical contact would be made to drain region 13 by the drain interconnection means. A further layer of interconnection means is required to electrically interconnect gate regions 16. Openings for such connections are not shown in FIG. 3B.

Figure 3C:
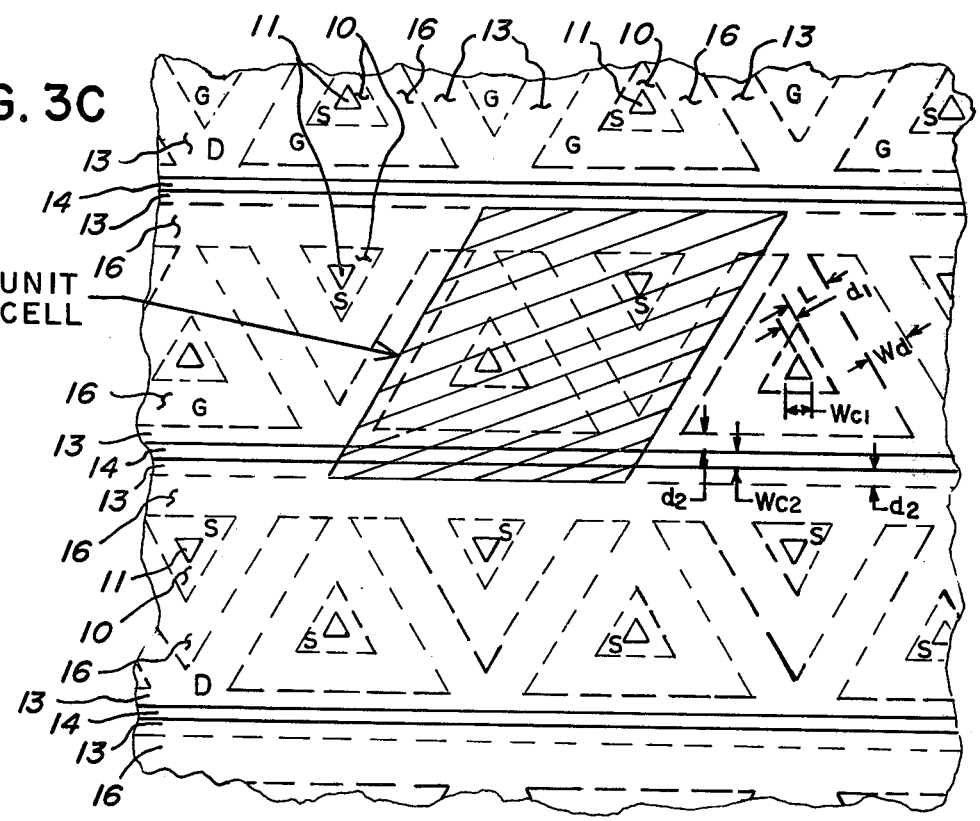

To avoid needing another interconnection means layer for electrically interconnecting the separated gate regions shown in FIG. 3B, the structure of FIG. 3C can be used to join, in the semiconductor material, the gate regions around the source region to thereby form a plurality of rows of joined gate regions. This provides the possibility of a single contiguous gate region in the semiconductor material of these rows are also joined in the material, or if not, at least no gate interconnections are required beyond those needed for interconnecting the rows. Other than the interconnecting of gate regions 16 in the semiconductor material in FIG. 3C, the structure shown in this figure is substantially that shown in structure in FIG. 3B.

The choice of what is designated as source regions 10 in FIGS. 3B and 3C—the region having triangular surface portions—as opposed to choosing drain regions 13 to have triangular surface portions is arbitrary. That is, the regions 13 marked with a D and the regions 10 marked with a S could have these markings interchanged so that the drain regions are the triangular surface portions and so that the source regions form a mesh surface portion surrounding the gate and drain triangular surface portions, respectively.

Choosing the structure shown in FIG. 3C for analysis, a unit cell has been shown there of the same nature and in the same manner as the unit cells shown in each of FIGS. 1C, 2 and 3A. The $R_{on}A$ product for the layout of FIG. 3C then is given as follows:

$$(R_{on}A)_{FIG.\ 3C} = \frac{L[3L + 3d_1 + 2d_2 + \frac{(3)^{\frac{1}{2}}}{2} w_{c1} + w_{c2}]}{\mu C_{ox} 6[2(3)^{\frac{1}{2}} L + 2(3)^{\frac{1}{2}} d_1 + w_{c1}](V_{GS} - V_T)}$$
$$[2(3)^{\frac{1}{2}} L + 2(3)^{\frac{1}{2}} d_1 + w_{c1} + \frac{4}{(3)^{\frac{1}{2}}} w_d].$$

In these equations L again represents the distance across the gate region while $w_d$ represents the width across the drain region arm. The symbols $w_{c1}$ and $w_{c2}$ are the contact opening dimensions for source regions 10 and drain regions 13, respectively. The distance $d_1$ and $d_2$ represent distances remaining in the source and drain regions outside the associated contact openings, respectively.

If the analysis of this last equation is pursued, one finds that the performance of the structure in FIG. 3C is approximately that of the structure shown in FIG. 3A with respect to the performance of the structure shown in FIG. 1C. Hence, the densely packed hexagonal matrix structure of FIG. 3A is approximately equal in the device performance to the structures shown in FIGS. 3B and 3C.

Figure 6:
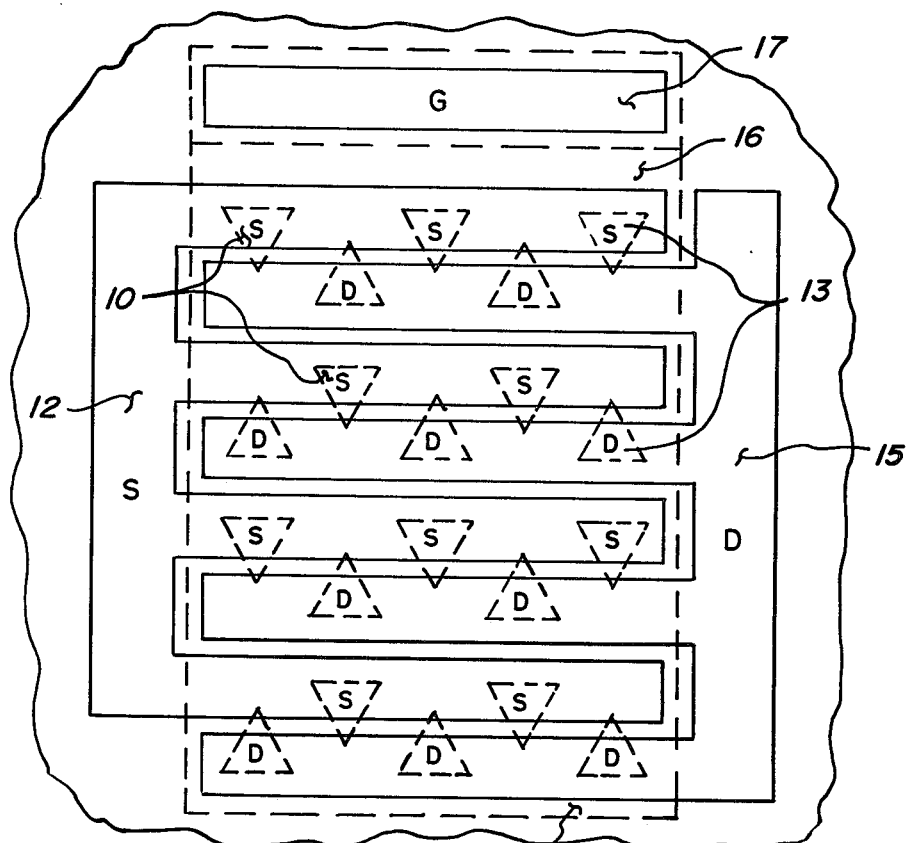
FIG. 6 shows a field-effect transistor device of the present invention.

FIG. 6 shows a top view of a field-effect transistor device of the present invention, related to FIG. 3A, without a passivating layer present over the source and drain interconnection means. Although the triangular surface portions resulting from the intersection in the semiconductor material body major surface of several source and drain regions are shown in FIG. 6, the few shown there should not necessarily be taken as being taken as being indicative of the number of source and drain regions which will be provided in the actual usable device. Rather, the number presented reflect the size which can be conveniently accommodated in the drawing. In actual use, there will usually be thousands of such triangular surface portions, often exceeding 50,000 in number.

The source interconnection means 12, typically formed with aluminum metal, is marked with a S as found in FIG. 1A. The drain interconnection means 15, again typically aluminum metal, is marked with a D as is also true in FIG. 1A.

The gate contact opening, 17, is marked with a G. The extension from gate contact opening 17 over the gate portions of the field-effect transistor device is again designated by 16, as in FIG. 1A, and includes the entire dashed line rectangle so marked but substantially excluding those portions over the triangular surface portions involving the source and drain regions. In a JFET, region 16 represents portions of the semiconductor body material which are of a conductivity type opposite that found in the source and drain regions. Region 16 could also be in this instance, a conductor over, and making contact to, such JFET gate regions used when the gate resistance is to be minimized. In a MOSFET, region 16 represents gate conductive material on an underlying insulating layer, usually silicon dioxide, which separates the semiconductor material body and the gate conductive material layer 16. Typically, in this instance, the region 16 gate conductive material is either of polysilicon or of metal. Polysilicon would be chosen for the most compact design because the layout spacing rules can be tightened because there is less chance with polysilicon of shorts to the overlying metal layers involving the source and drain interconnection means. However, a metal for gate 16 would be chosen when fast switching speed is the primary desire because there is less lead resistance when metal is used therefor.

The triangular surface portions 10 in the major surface of the semiconductor material body due to the intersecting source regions, shown under a silicon dioxide insulating layer, are again each marked with a S in FIG. 6 as the source region was in FIG. 1A. The triangular surface portions 13 due to the drain regions are each marked with a D as was the drain region in FIG. 1A. A further passivating layer, typically of doped silicon dioxide, would also be provided over the structure shown in FIG. 6 but has been omitted here for clarity.

Figure 7:
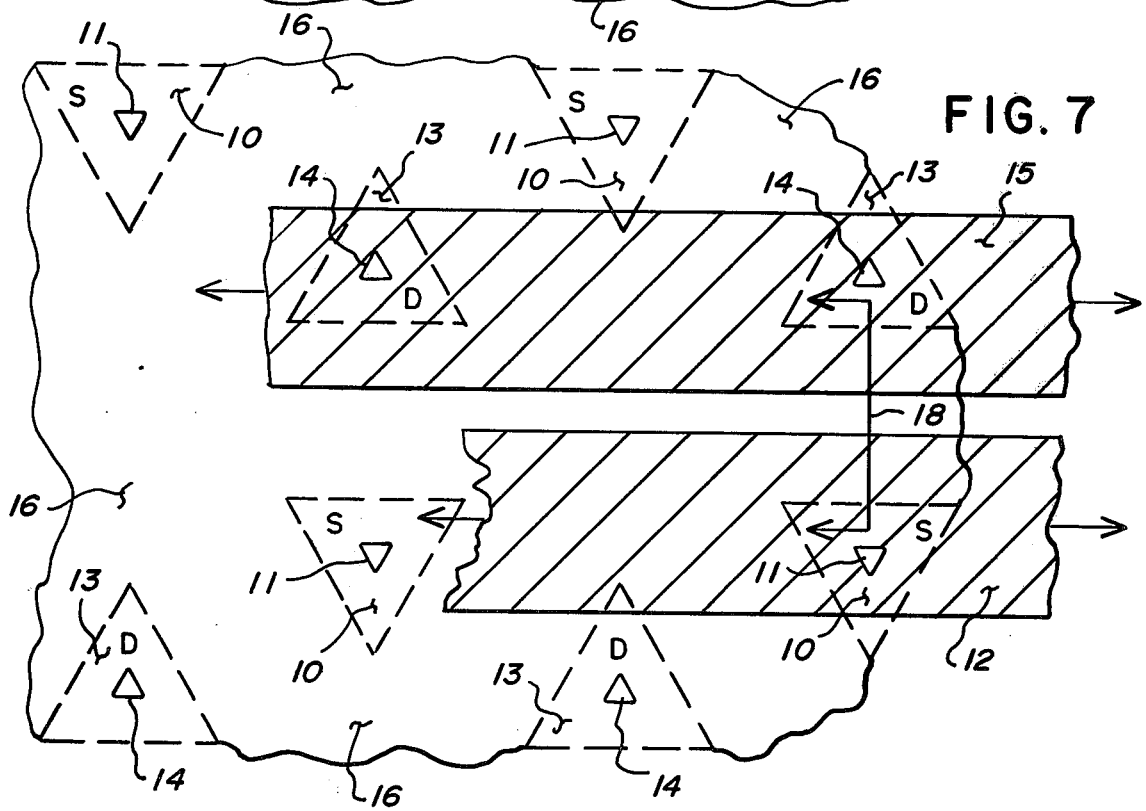
FIG. 7 shows a portion of the field-effect transistor device of FIG. 6.

The portion of FIG. 6 contained in the closed wavey line is shown again, for the most part, in FIG. 7 for a MOSFET device. The same numeral designations are retained in FIG. 7 as have been used in FIG. 6. Contact cuts, through the insulating layer disposed between the source and drain interconnection means and the semiconductor material body, to accommodate electrical contacts to the source and drain regions below by these interconnection means are shown in FIG. 7. These contact cuts are identified in FIG. 7, as they were in FIG. 1A, as source contact cuts 11 and drain contact cuts 14.

Figure 8:
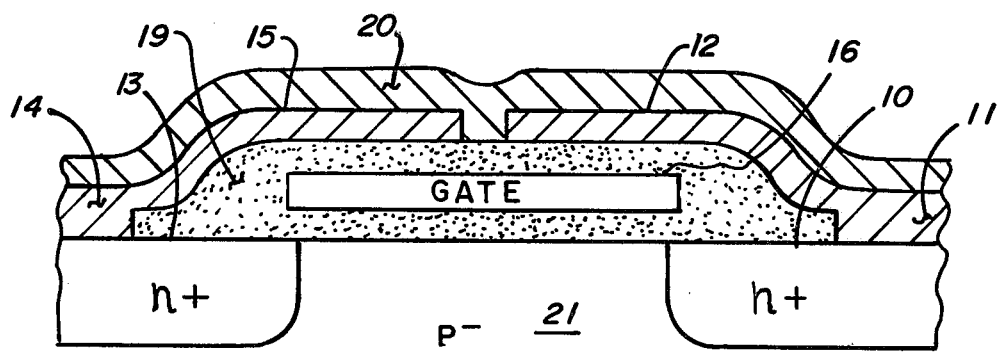
FIG. 8 shows a cross section of a portion of one version of the field-effect transistor device of FIG. 7.

A section line, 18, is shown in FIG. 7 and the corresponding section portion is shown in FIG. 8. Again, the same numerals have been retained in FIG. 8 as were used in FIGS. 6 and 7. A phosphosilicate glass passivating layer, 20, has been added in FIG. 8 which is not present in FIGS. 6 and 7. A silicon dioxide insulating region, 19, protects the gate and separates it from the semiconductor material body major surface.

The n-type conductivity drain region associated with the triangular surface portion 13 is typically provided by a phosphorus dopant through diffusion or implantation in the silicon semiconductor material body, 21, where the dopant reaches the concentration of approximately $10^{18}$ atoms/cm$^3$. The source region associated with surface portion 10 is similarly provided. The semiconductor material body outside of the source and drain regions is typically of p-type conductivity due to a boron dopant therein to the extent of approximately $2 \times 10^{15}$ atoms/cm$^3$. A typical spacing between the source and drain regions, as indicated earlier, would be 7.5 μm. A typical separation between the semiconductor material body in 21 and the gate would be 1,000 Å.

An MOS device can be built somewhat differently than shown in FIG. 8 by having the gate 16 remain as shown but having the source region 10 and the gate region 13 provided by a doped polysilicon deposition on the major surface of the semiconductor material body immediately adjacent the gate. In this situation, there would not be substantial doped regions provided in the semiconductor material body to serve as source and drain regions.

Figure 9:
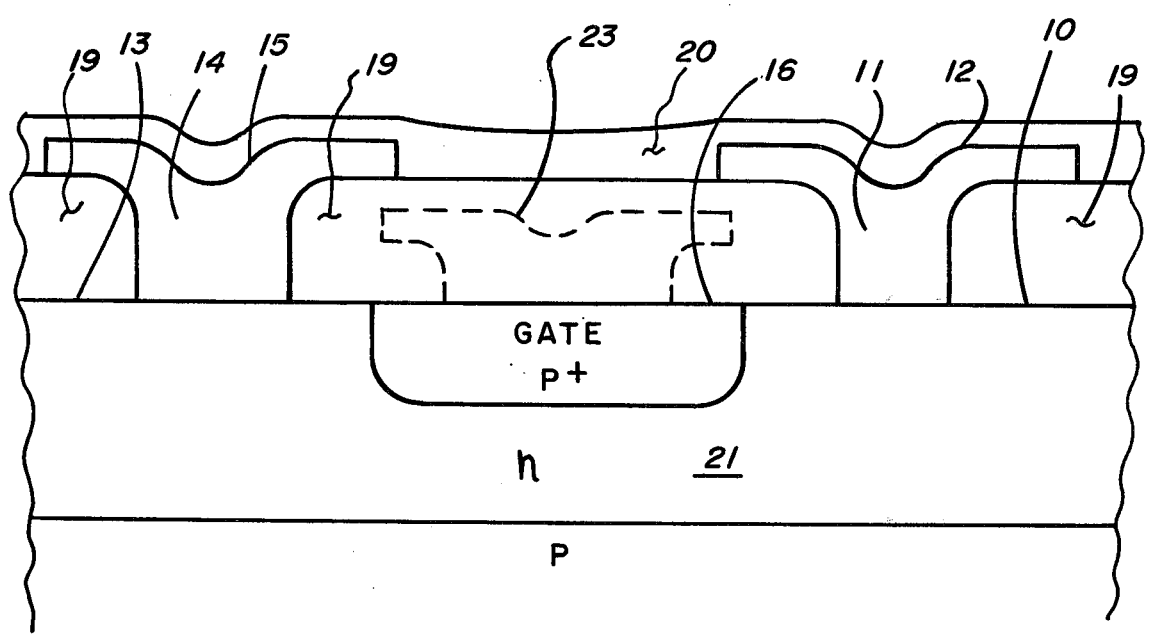
FIG. 9 shows the cross section of a portion of another version of the field-effect transistor device of FIG. 7.

FIG. 9 shows the JFET configuration corresponding to FIGS. 6 and 7, again retaining the same numeral designations for common or similar structural portions. Now, however, the semiconductor material body 21 represents an n-type conductivity silicon epitaxial layer doped with $10^{15}$ atoms/cm$^3$ of phosphorus, formed over a p-type conductivity silicon substrate, 22, doped with $5 \times 10^{14}$ atoms/cm$^3$ of boron. Layer 21 contains the source and drain regions forming the triangular surface portions at its major surface. These source and drain regions partly surround the gate region 16 so that then drain and source regions are continuous below gate region 10, i.e. are contiguous with one another. Gate region 16 is formed by doping with boron to the extent of $10^{18}$ atoms/cm$^3$.

Another layer of metal, 23, is shown in FIG. 9 by dashed lines as a gate electrical connector to the gate region 16 surface which, in ohmic contact with the surface of region 16, could alternatively be used to reduce gate resistance rather than using the gate region in the semiconductor body as the sole gate interconnection means. If the region in layer 21 serving as the gate region were eliminated, metal layer 23 in rectifying contact with layer 21 would serve to define the gate region 16 in a Schottky barrier field-effect transistor device.

The cross sections shown in FIGS. 8 and 9 would be approximately the same, if properly chosen, for figures related to FIGS. 3B and 3C as FIGS. 6 and 7 are related to FIG. 3A. That is, the change in geometrical arrangement in going from FIG. 3A to FIGS. 3B and 3C would not require substantial fabrication process changes.

Figure 10:
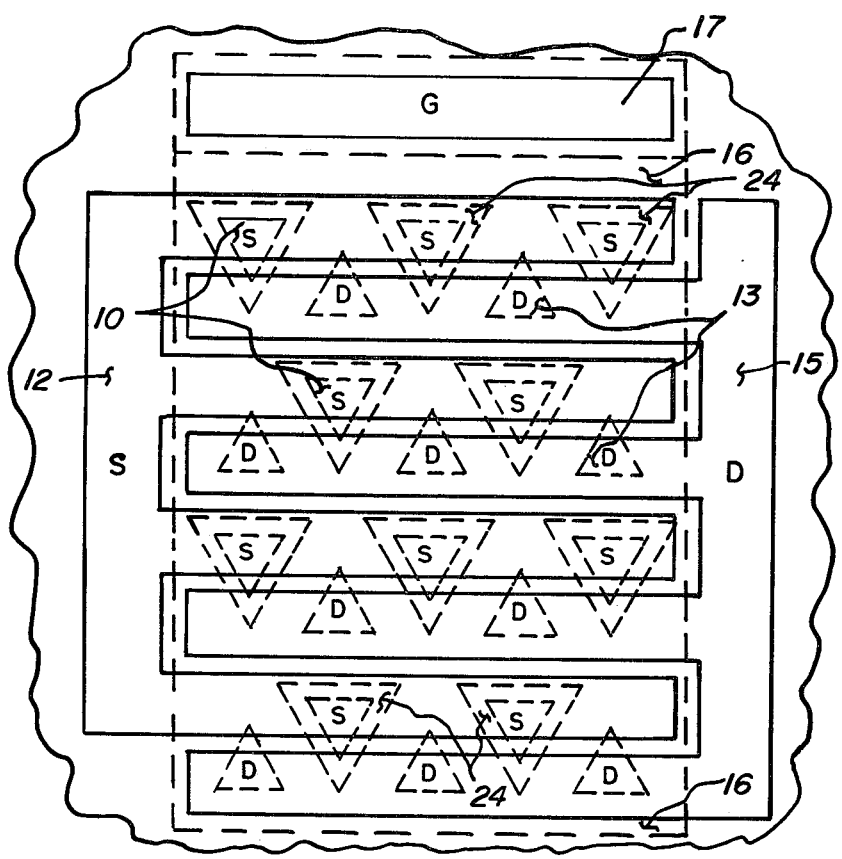
FIG. 10 shows another field-effect transistor device of the present invention.

Turning now to FIG. 10, this figure is a repeat of what is shown in FIG. 6 with the exception of the addition of a region surrounding the source regions in the semiconductor material body which also intersects the major surface of that body. These additional regions, 24, represent the channel regions for a D-MOS type field-effect transistor device. (FIG. 10 also can be viewed to an extent as being approximately reprentative of a figure related to FIG. 3B as FIG. 6 relates to FIG. 3A.)

Figure 12:
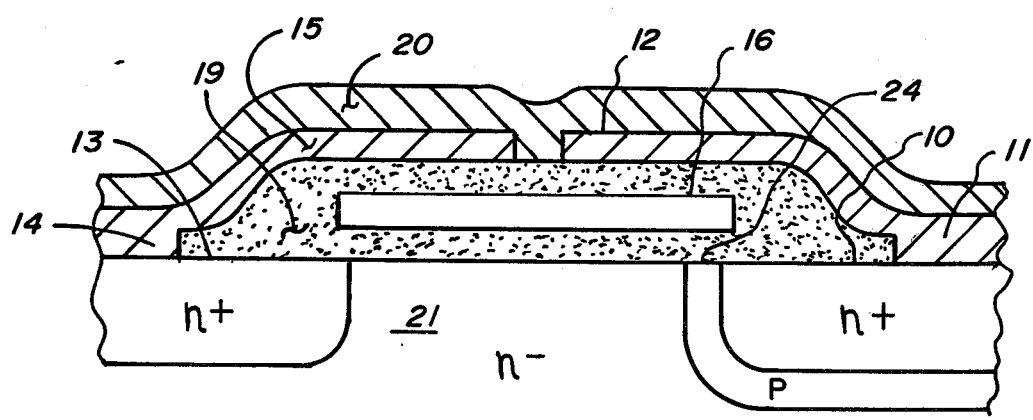
FIG. 12 shows a cross section of a portion of one version of the field-effect transistor device of FIG. 11.
Figure 11:
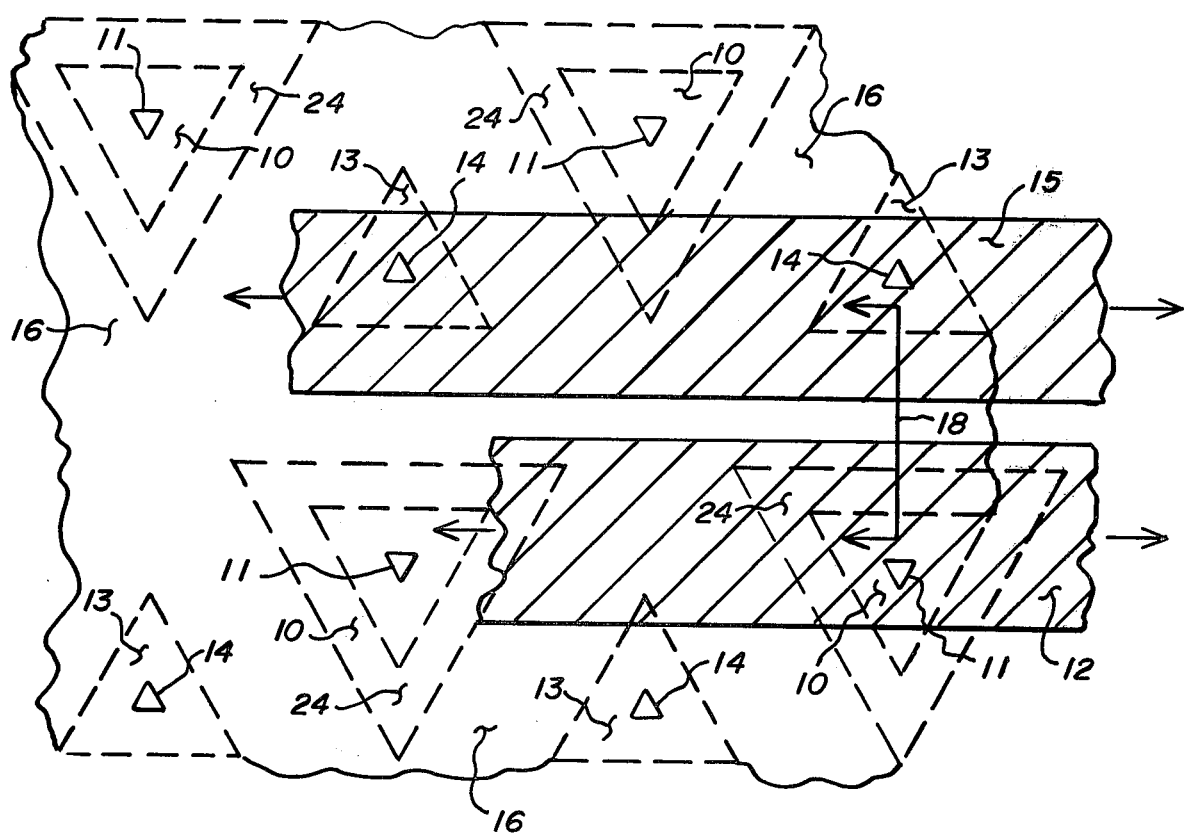
FIG. 11 shows a portion of the field-effect transistor device of FIG. 10.

FIG. 11 shows again the portion of FIG. 10 enclosed by the wavey line there, and corresponds to FIG. 7. Again, in FIG. 11, regions 24 represent the channel regions for a D-MOS with no other substantial changes from FIG. 7. Finally, FIG. 12 shows the section 18 taken of a portion of FIG. 11 indicating a cross section of that portion of the device in FIG. 11. Here certain changes appear, although similar regions are designated by the same numerals as they are in the corresponding FIG. 8.

The major change is that the semiconductor body material 21, while again silicon, is now doped to have an n-type conductivity due to a phosphorus dopant present in the amount of $10^{15}$ atoms/cm$^3$. The source region having a triangular surface portion 10 and the drain region having triangular surface portion 13 are again n-type conductivity due to the presence of a phosphorus dopant in a concentration of $10^{18}$ atoms/cm$^3$. The second change, of course, is the presence of region 24 of p-type conductivity due to the presence of boron in the concentration of $10^{16}$ atoms/cm$^3$. The device of FIGS. 10, 11, and 12 operate in the usual D-MOS device manner.

Figure 13:
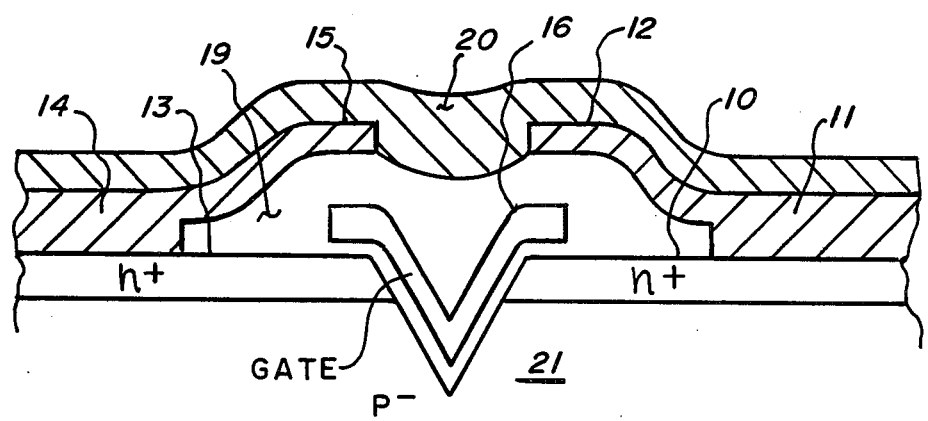
FIG. 13 shows the cross section of a portion of another version of the field-effect transistor device of FIG. 7.

A densely packed, hexagonal matrix structure is also applicable for use with a V-MOS-like field-effect transistor device, either a surface V-MOS device or a vertical V-MOS device using the substrate as the drain. That is, the portions 16 of FIGS. 6 and 7 will represent the device gate formed over a V-groove provided in the semiconductor material body. For a surface V-MOS, the triangular surface portions 10 and 13 will again represent intersections of source and drain regions with the semiconductor material body major surface as can be seen in FIG. 13 representing the corresponding cross section 18 of FIG. 7. Again in FIG. 13, the same designations are retained for corresponding portions of the structure as have been used in the previous figures. Semiconductor body material 21 is of p-type conductivity due to boron doping to the extent of $10^{15}$ atoms/cm$^3$. The source and drain regions are of n-type conductivity because of boron doping of $10^{18}$ atoms/cm$^3$. The gate may be either doped polysilicon or metal.

A corresponding cross section 18 from FIG. 7 for a conventional V-MOS device is shown in FIG. 14 where there is again used the common numeral designation employed for corresponding structures in previous figures. However, for a conventional V-MOS, the triangular surface portions that were labeled 13 corresponding to drain region intersections with the semiconductor material body major surface are now labeled as source regions. This is because all of the triangular surface portions are related to source regions with the semiconductor material substrate serving as the drain region in a conventional V-MOS. This is noted in FIG. 14 by the designation 10 (13). That is, the regions 21', in the semiconductor material body have intersections with the major surface of the semiconductor material body in the form of triangular surface portions and are of an n-type conductivity due to doping by phosphorus to the extent $10^{18}$ atoms/cm$^3$.

Below the semiconductor material body source regions 21', with the triangular surface portions 10 and 10 (13), there is provided the "body" region, 25, of p-type conductivity due to doping by boron in a concentration of $10^{16}$ atoms/cm$^3$. The dashed line shown in regions 21', indicate that the V-MOS device can be formed with the "body" region 25 intersecting the triangular surface portion 10 and 10 (13) such that the regions 21', surround the portions of region 25 which intersect the triangular surface portions.

Figure 14:
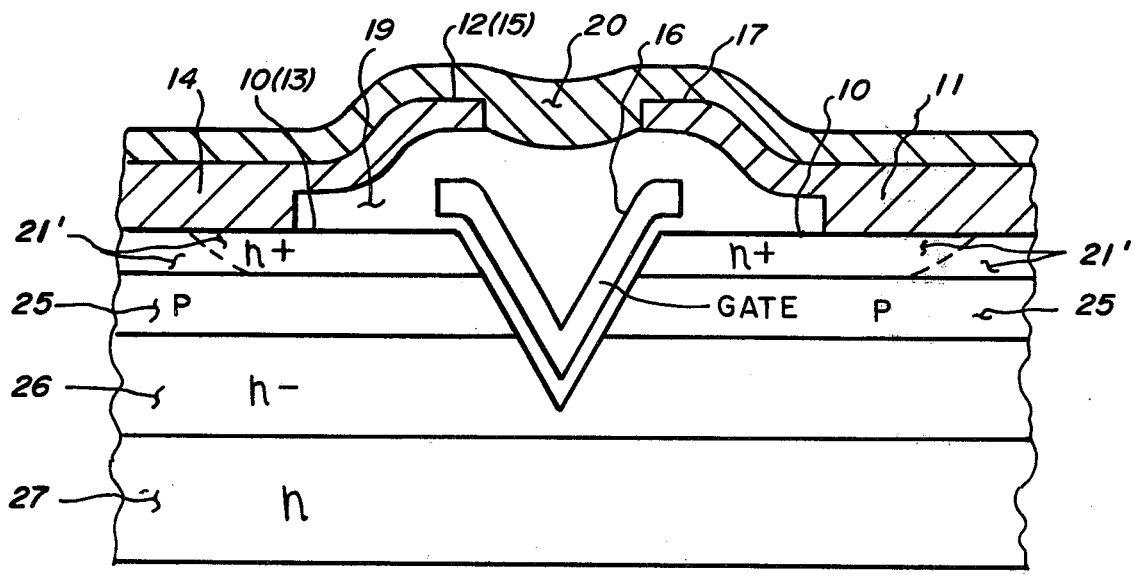
FIG. 14 shows the cross section of a portion of another version of the field-effect transistor device of FIG. 7.

Thus, the V-MOS device of FIG. 14 can be arranged so that the source interconnection means 12, and what has been the drain interconnection means which is now also a source interconnection means, and so relabeled 12 (15), can electrically contact only region 21' leaving region 25 floating as a first possibility. In this situation no portion of region 25 intersects the semiconductor material body major surface and is not directly connected to any interconnection means or to power source terminal in operation.

On the other hand, the source interconnection means 12 and 12 (15) can electrically contact both regions 21' and regions 25 with regions 25 outersecting the semiconductor material body major surface as shown by the dashed lines in FIG. 14. This latter electrical contact scheme is preferred for very high frequency operations to suppress transient phenomena. Operating at low frequencies presents no problems with region 25 either floating or not.

A low conductivity semiconductor layer, 26, underlies regions 25 and is of n-type conductivity due to doping by phosphorus to the degree of $10^{15}$ atoms/cm$^3$. This low conductivity layer in turn is provided on a substrate, 27, of a higher n-type conductivity due to doping by arsenic in the concentration of $10^{18}$ atoms/cm$^3$. Region 26 is provided to increase the breakdown voltage between the source and drain by providing a region in which the depletion layer can spread. Region 27 serves as the drain region for the V-MOS device. Regions 25 and 26 are usually provided by epitaxial deposition of silicon on the silicon semiconductor substrate 27 with regions 21', being thereafter diffused.

The embodiments of the invention in which an exclusive property or right is claimed are defined as follows:

1. A semiconductor device containing therein a first field-effect transistor device, having a source, drain and gate, and exhibiting a relatively low resistance between said source and drain when in an "on" condition, said first field-effect transistor device comprising:

a semiconductor material body of a first conductivity type, in at least some portions thereof, and having a first major surface;

a first plurality of regions of a second conductivity type each located in said semiconductor material body in such a manner as to intersect said first major surface in a first plurality of triangular surface portions completely separated in said first major surface and at least partly so separated by a first surface mesh formed by other portions of said semiconductor material body, each said triangular surface portion in said first plurality thereof having each of those edges serving as boundaries thereof, including an outer edge, substantially parallel to one edge in every other triangular surface portion in said first plurality of triangular surface portions, said first plurality of triangular surface portions being arranged along a first direction in said first major surface such that each said outer edge in each said triangular surface portion in said first plurality thereof is substantially parallel to said first direction;

a second plurality of regions of said second conductivity type located in said semiconductor material body in such a manner as to intersect said first major surface in a second plurality of triangular surface portions completely separated in said first major surface and at least partly so separated by a second surface mesh formed by other portions of said semiconductor material body, each said triangular surface portion in said second plurality thereof having each of those edges serving as boundaries thereof, including an outer edge, substantially parallel to one edge in every other triangular surface portion in said second plurality of triangular surface portions, said second plurality of triangular surface portions being arranged along said first direction such that each said outer edge in each said triangular surface portion in said second plurality thereof is substantially parallel to said first direction, said first and second pluralities of triangular surface portions being adjacent but spaced apart from one another in said first major surface by portions of said first and second surface meshes with an outer edge of every other triangular surface portion in said first plurality thereof being located just across said spacing from an outer edge of a triangular surface portion in said second plurality thereof;

a gate region located adjacent to said first major surface;

a first interconnection means electrically interconnecting selected said triangular surface portions in both said first and second pluralities of regions; and a second interconnection means being in electrical contact with said first major surface.

2. The device of claim 1 wherein said gate region is provided by a conductor located adjacent to said first major surface as aforesaid.

3. The device of claim 1 wherein said gate region is at least partly provided by portions of said semiconductor material body of said first conductivity type which intersect said first major surface with said first and second pluralities of regions being contiguous with regions of said semiconductor material body of said second conductivity type sufficiently to together be partly around said gate region.

4. The device of claim 1 wherein said first interconnection means and said second interconnection means each have portions thereof which are generally elongated along said first direction and which are disposed upon at least one insulating layer formed between said elongated portions and said semiconductor material body, said elongated portions in said first interconnection means making ohmic contact to selected said triangular surface portions, as aforesaid, through openings in said insulating layer.

5. The device of claim 1 wherein said triangular surface portions are formed as equilateral triangles.

6. The device of claim 1 wherein there is contained another transistor device.

7. The device of claim 2 wherein said conductor is spaced apart from said first major surface by a thin insulating layer.

8. The device of claim 2 wherein said conductor is disposed in rectifying contact on said first major surface to define said first and second surface meshes with said first and second pluralities of regions being contiguous, said first interconnection means being a source interconnection means and said second interconnection means being a drain interconnection means with each electrically interconnecting alternate triangular surface portions in both said first and second pluralities of regions.

9. The device of claim 2 wherein said conductor is disposed in rectifying contact on said first major surface to define a plurality of substantially coincident surface portions, each completely containing one of said triangular surface portions in said first and second pluralities of regions, with said coincident surface portions also separated at least partly by said first and second surface meshes, said first interconnection means being a source interconnection means and said second interconnection means being a drain interconnection means with said source interconnection means electrically interconnecting each said triangular surface portion in both said first and second pluralities of regions and said drain interconnection means being electrically in contact with said first surface mesh, said other portions of said semiconductor material body forming said first and second surface meshes being of said second conductivity type and being contiguous with said first and second pluralities of regions.

10. The device of claim 3 wherein said portions of said semiconductor material body forming said gate region, in intersecting said first major surface as aforesaid, form said first and second surface meshes, said first interconnection means being a source interconnection means and said second interconnection means being a drain interconnection means with each electrically interconnecting alternate said triangular surface portions in both said first and second pluralities of regions.

11. The device of claim 3 wherein said portions of said semiconductor material body forming said gate region, in intersecting said first major surface as aforesaid, form a plurality of substantially coincident surface portions, each completely containing one of said triangular surface portions in said first and second pluralities of regions, with said coincident surface portions also being separated at least partly by said first and second surface meshes, said first interconnection means being a source interconnection means and said second interconnection means being a drain interconnection means with said source interconnection means electrically interconnecting each said triangular surface portion in both said first and second pluralities of regions and said drain interconnection means being electrically in contact with said first surface mesh.

12. The device of claim 4 wherein said first interconnection means is a source interconnection means and said second interconnection means is a drain interconnection means with each electrically interconnecting alternate said triangular surface portions in both said first and second pluralities of regions, said gate region being located adjacent to said first and second surface meshes.

13. The device of claim 4 wherein there is a plurality of substantially coincident surface portions, each completely containing one of said triangular surface portions in said first and second pluralities of regions, and formed by still other portions of said semiconductor material body with said coincident surface portions also being separated at least partly by said first and second surface meshes, said first interconnection means being a source interconnection means and said second interconnection means being a drain interconnection means with said source interconnection means electrically interconnecting each said triangular surface portion in both said first and second pluralities of regions and said drain interconnection means being electrically in contact with said first surface mesh, said gate region being located adjacent to said plurality of substantially coincident surface portions.

14. The device of claim 7 wherein said conductor is of metal.

15. The device of claim 7 wherein said conductor is of polysilicon and said semiconductor material body is of silicon.

16. The device of claim 7 wherein said first interconnection means is a source interconnection means and said second interconnection means is a drain interconnection means with each electrically interconnecting alternate said triangular surface portions in both said first and second pluralities of regions, said gate region being adjacent to said first and second surface meshes.

17. The device of claim 7 wherein there is a plurality of substantially coincident surface portions, each completely containing one of said triangular surface portions in said first and second pluralities of regions, and formed by still other portions of said semiconductor material body with said coincident surface portions also being separated at least partly by said first and second surface meshes, said first interconnection means being a source interconnection means and said second interconnection means being a drain interconnection means with said source interconnection means electrically interconnecting each said triangular surface portion in both said first and second pluralities of regions and said drain interconnection means being electrically in contact with said first surface mesh, said gate region being located adjacent to said plurality of substantially coincident surface portions.

18. The device of claim 7 wherein those regions having triangular surface portions interconnected by said first interconnection means are each surrounded on surface portions other than said triangular surface portions by surrounding regions having a third conductivity type which intersect said first major surface in first substantially coincident surface portions immediately adjacent to, and containing, those said triangular surface portions interconnected by said first interconnection means, said first coincident surface portions being completely separated and at least partly so by said first and second surface meshes, said first conductivity type being also said second conductivity type which is opposite to said third conductivity type.

19. The device of claim 18 wherein said first interconnection means is a source interconnection means and said second interconnection means is a drain interconnection means with each electrically interconnecting alternate said triangular surface portions in both said first and second pluralities of regions, said gate region being located adjacent to said first and second surface meshes.

20. The device of claim 18 wherein there is a plurality of second substantially coincident surface portions, each completely containing both one of said triangular surface portions in said first and second pluralities of regions and a first coincident surface portion, and formed by still other portions of said semiconductor material body with said second coincident surface portions also being separated at least partly by said first and second surface of meshes, said first interconnection means being a source interconnection means and said second interconnection means being a drain interconnection means with said source interconnection means electrically interconnecting each said triangular surface portion in both said first and second pluralities of regions and said drain interconnection means being electrically in contact with said first surface mesh, said gate region being located adjacent to said plurality of second coincident surface portions.

21. A field-effect transistor device, having a source, drain and gate, and exhibiting a relatively low resistance between said source and drain when in an "on" condition, said field-effect transistor device comprising:
   a semiconductor material body of a first conductivity type, in at least some portions thereof;
   a plurality of regions located at a surface of said semiconductor material body each having a triangular surface portion with every said triangular surface portion being completely separated at said semiconductor material body surface from one another, there being interposed therebetween a separating surface in said semiconductor material body surface formed by other portions of said semiconductor material body, and further, with said separating surface being associated so that all of said separating surface may be viewed as being apportioned for assignment to an associated one of said triangular surface portions in a manner to form extended triangular surface portions each containing therein its associated said triangular surface portion, said triangular surface portions being arranged with respect to one another in such a manner that said associated extended triangular surface portions form a densely packed hexagonal matrix structure;
   a gate region located adjacent to said semiconductor material body surface;
   a first interconnection means electrically interconnecting selected triangular surface portions; and
   a second interconnection means being in electrical contact with said device.

22. The device of claim 21 wherein said gate region is provided by a conductor located adjacent to said semiconductor material body surface.

23. The device of claim 21 wherein said gate region is at least partly provided by portions of said semiconductor material body of said first conductivity type which intersect said semiconductor material body surface, said plurality of regions being in said semiconductor material body and of a second conductivity type and being contiguous with regions of said semiconductor material body of said second conductivity type sufficiently to together be partly around said gate region.

24. The device of claim 21 wherein said first interconnection means and said second interconnection means each have portions thereof which are generally elongated along a direction parallel to a rotational symmetry axis in said hexagonal matrix structure and which are disposed upon at least one insulating layer formed between said elongated portion and at least said triangular surface portions, said elongated portions in said first interconnection means making ohmic contact to selected said triangular surface portions of a second conductivity type, as aforesaid, through openings in said insulating layer.

25. The device of claim 21 wherein said triangular surface portions are formed as equilateral triangles.

26. The device of claim 21 wherein there is contained another transistor device.

27. The device of claim 22 wherein said conductor is spaced apart from said separating surface by a thin insulating layer.

28. The device of claim 22 wherein said conductor is disposed in rectifying contact on said semiconductor material body surface to define said separating surface with said plurality of regions being in said semiconductor material body and of a second conductivity type and being contiguous, said first interconnection means being a source interconnection means and said second interconnection means being a drain interconnection means with each electrically interconnecting alternate said traingular surface portions in said plurality of regions.

29. The device of claim 22 wherein said conductor is disposed in rectifying contact on said semiconductor material body surface to define a plurality of substantially coincident surface portions, each completely containing one of said triangular surface portions in said plurality of regions but contained in turn in said associated extended triangular surface portion, with said coincident surface portion also being separated at least partly by said separating surface, said first interconnection means being a source interconnection means and said second interconnection means being a drain interconnection means with said source interconnection means electrically interconnecting each said triangular surface portion in said plurality of regions and said drain interconnection means being in electrical contact with said separating surface, said plurality of regions being in said semiconductor material body of a second conductivity type and being contiguous with said portions of said semiconductor material body of a second conductivity type forming said separating surface.

30. The device of claim 23 wherein said portions of said semiconductor material body forming said gate regions, in intersecting said semiconductor material body surface as aforesaid, form said separating surface, said first interconnection means being a source interconnection means and said second interconnection means being a drain interconnection means with each electrically interconnecting alternate said triangular surface portions in said plurality of source regions.

31. The device of claim 23 wherein said other portions of said semiconductor material body forming said gate region, in intersecting said semiconductor material body surface as aforesaid, form a plurality of substantially coincident surface portions, each completely containing one of said triangular surface portions in said plurality of regions but contained in turn in said associated extended triangular surface portions, with said coincident surface portions also being separated at least partly by said separating surface, said first interconnection means being a source interconnection means and said second interconnection means being a drain interconnection means with said source interconnection means electrically interconnecting each said triangular surface portion in said plurality of regions and said drain interconnection means electrically in contact with said separating surface.

32. The device of claim 24 wherein said first interconnection means is a source interconnection means and said second interconnection means is a drain interconnection means with each electrically interconnecting alternate said triangular surface portions in said plurality of regions, said gate region being located adjacent to said separating surface.

33. The device of claim 24 wherein there is a plurality of substantially coincident surface portions, each completely containing one of said triangular surface portions in said plurality of regions but contained in turn within said associated extended triangular surface portion, and formed by still other portions of said semiconductor material body with said coincident surface portions also being separated at least partly by said separating surface, said first interconnection means being a source interconnection means and said second interconnection means being a drain interconnection means with said source interconnection means electrically interconnecting each said triangular surface portion in said plurality of regions and said drain interconnection means being electrically in contact with said separating surface, said gate region being located adjacent to said plurality of substantially coincident surface portions.

34. The device of claim 27 wherein said conductor is of metal.

35. The device of claim 27 wherein said conductor is of polysilicon and said semiconductor material body is of silicon.

36. The device of claim 27 wherein said first interconnection means is a source interconnection means and said second interconnection means is a drain interconnection means with each electrically interconnecting alternate triangular surface portions in said plurality of regions, said gate region being adjacent to said separating surface.

37. The device of claim 27 wherein there is a plurality of substantially coincident surface portions, each completely containing one of said triangular surface portions in said plurality of regions but contained in turn in said associated extended triangular surface portions, and formed by still other portions of said semiconductor material body with said coincident surface portions also being separated at least partly by said separating surface, said first interconnection means being a source interconnection means and said second interconnection means being a drain interconnection means with said source interconnection means electrically interconnecting each said triangular surface portion in said plurality of regions and said drain interconnection means being electrically in contact with said separating surface, said gate region being located adjacent to said plurality of substantially coincident surface portions.

38. The device of claim 27 wherein said plurality of regions are each in said semiconductor material body and of a second conductivity type, said source regions being each surrounded on surface portions other than said triangular surface portions by surrounding regions having a third conductivity type which intersect said semiconductor material body surface in first substantially coincident surface portions immediately adjacent to, and containing, those said triangular surface portions interconnected by said first interconnection means, said first coincident surface portions being completely separated and at least partly so by said separating surface, said first conductivity type being also said second conductivity type which is opposite said third conductivity type.

39. The device of claim 27 wherein said plurality of regions are each in said semiconductor material body and of a second conductivity type.

40. The device of claim 38 wherein said first interconnection means is a source interconnection means and said second interconnection means is a drain interconnection means with each electrically connecting alternate said triangular surface portions in said plurality of regions, said gate region being located adjacent to said separating surface.

41. The device of claim 38 wherein there is a plurality of second substantially coincident surface portions, each completely containing both one of said triangular surface portions in said plurality of regions and a first coincident surface portion, but contained in turn in said associated extended triangular portion, and formed by still other portions of said semiconductor material body with said second coincident surface portions also being separated at least partly by said separating surface, said first interconnection means being a source interconnection means and said second interconnection means being a drain interconnection means with said source interconnection means electrically interconnecting each said triangular surface portion in said plurality of regions and said drain interconnection means being electrically in contact with said separating surface, said gate region being located adjacent to said plurality of second substantially coincident surface portions.

42. The device of claim 39 wherein said separating surface is a surface groove in said semiconductor material body.

43. A field-effect transistor device, having a source, drain and gate, and exhibiting a relatively low resistance between said source and drain when in an "on" condition, said field-effect transistor device comprising:
a semiconductor material body of a first conductivity type, in at least some portions thereof;
a mesh surface in said semiconductor material body having a portion thereof formed as an intersecting network in a mesh pattern having triangular openings;
a plurality of source regions each located to have a surface thereof contained completely within one of said triangular openings;
a first drain region located adjacent to said mesh surface portion;
a gate region located adjacent to said mesh surface;
a source interconnection means electrically interconnecting said plurality of source regions; and
a drain interconnection means in electrical contact with said first drain region.

44. The device of claim 43 wherein said gate region is provided by a conductor located adjacent to said mesh surface as aforesaid.

45. The device of claim 43 wherein said gate region is at least partly provided by portions of said semiconductor material body of said first conductivity type which intersect said mesh surface, said plurality of source regions being in said semiconductor material body and of a second conductivity type and being contiguous with regions of said semiconductor material body of said second conductivity type sufficiently to together be partly around said gate region.

46. The device of claim 43 wherein said source interconnection means and said drain interconnection means each have portions thereof which are generally elongated along a direction parallel to at least one network line in said mesh pattern and which are disposed upon at least one insulating layer formed between said elongated portions and said mesh surface, said elongated portions in said source interconnection means making ohmic contact to said plurality of source regions of a second conductivity type, as aforesaid, through openings in said insulating layer.

47. The device of claim 43 wherein said triangular openings are formed as equilateral triangles.

48. The device of claim 43 wherein there is contained another transistor device.

49. The device of claim 44 wherein said conductor is spaced apart from said surface portion by a thin insulating layer.

50. The device of claim 44 wherein there is a plurality of drain regions each located to have a surface thereof contained completely within one of said triangular openings but alternating with similarly located said source region surfaces including said first drain region, said drain regions all electrically interconnected by said drain interconnection means, and wherein said conductor is disposed in rectifying contact on said mesh surface to define said mesh surface portion with said pluralities of source and drain regions being in said semiconductor material body and of a second conductivity type and being contiguous.

51. The device of claim 44 wherein said conductor is disposed in rectifying contact on said mesh surface to define a plurality of substantially coincident surface portions, each completely containing one of said source region surfaces but contained in turn within one of said triangular openings, with said coincident surface portions also being separated at least partly by said mesh surface portion, said drain interconnection means being electrically in contact with said mesh surface portion, said drain and source regions being in said semiconductor body and of a second conductivity type and being contiguous.

52. The device of claim 45 wherein said portions of semiconductor material body forming said gate region, in intersecting said mesh surface as aforesaid, form said mesh surface portion, there being a plurality of drain regions, each also located to have a surface thereof contained completely within one of said triangular openings but in alternate locations to similarly located said source region surfaces, including said first drain region, with said drain regions all electrically interconnected by said drain interconnection means.

53. The device of claim 45 wherein said portions of said semiconductor material body forming said gate region, in intersecting said mesh surface as aforesaid, form a plurality of substantially coincident surface portions, each completely containing one of said source region surfaces but contained in turn at least partly in one of said triangular openings, with said coincident surface portion also being separated at least partly by said mesh surface portion, said drain interconnection means being electrically in contact with said mesh surface portion.

54. The device of claim 46 wherein there is a plurality of drain regions, each also located to have a surface thereof contained completely within one of said triangular openings but in alternate locations to similarly located said source region surfaces, including said first drain region, with said drain regions all electrically interconnected by said drain interconnection means, said gate region being located adjacent to said mesh surface portion.

55. The device of claim 46 wherein there is a plurality of substantially coincident surface portions, each completely containing one of said source region surfaces but contained in turn at least partly in one of said triangular openings, and formed by other portions of said semiconductor material body with said coincident surface portions also being separated at least partly by said mesh surface portion, said drain interconnection means being electrically in contact with said mesh surface portion, said gate regions being adjacent to said plurality of substantially coincident surface portions.

56. The device of claim 49 wherein said conductor is of metal.

57. The device of claim 49 wherein said conductor is of polysilicon and said semiconductor material body is of silicon.

58. The device of claim 49 wherein there is a plurality of drain regions, each also located to have a surface thereof contained completely within one of said triangular openings but in alternate locations to similarly located said source region surfaces, including said first drain region, with said drain regions all electrically interconnected by said drain interconnection means, said gate region being located adjacent to said mesh surface portion.

59. The device of claim 49 wherein there is a plurality of substantially coincident surface portions, each completely containing one of said source region surfaces but contained in turn at least partly in one of said triangular openings, and formed by other portions of said semiconductor material body with said coincident surface portions also being separated at least partly by said mesh surface portion, said drain interconnection means being electrically in contact with said mesh surface portion, said gate regions being adjacent to said plurality of substantially coincident surface portions.

60. The device of claim 49 wherein said plurality of source regions are each in said semiconductor material body and of a second conductivity type, said source regions being each surrounded on surface portions other than said source region surfaces by surrounding regions having a third conductivity type which intersect said mesh surface in first substantially coincident surface portions immediately adjacent to, and containing, said source region surfaces, said first coincident surface portions being completely separated and at least partly so by said separating surface, said first conductivity type being also said second conductivity type which is opposite said third conductivity type.

61. The device of claim 49 wherein said drain region and said plurality of source regions are in said semiconductor material body and of said first conductivity type, said mesh surface portion being a surface in a groove in said semiconductor material body.

62. The device of claim 49 wherein there is a plurality of drain regions, each also located to have a surface thereof contained completely within one of said triangular openings but in alternate locations to similarly located said source region surfaces, including said first drain region, with said drain regions all electrically interconnected by said drain interconnection means and wherein said pluralities of source and drain regions are in said semiconductor material body and of a second conductivity type.

63. The device of claim 60 wherein there is a plurality of drain regions, each also located to have a surface thereof contained completely within one of said triangular openings but in alternate locations to similarly located said source region surface, including said first drain region, with said drain regions all electrically interconnected by said drain interconnection means, said gate region being located adjacent to said mesh surface portion.

64. The device of claim 60 wherein there is a plurality of second substantially coincident surface portions, each completely containing both one of said source region surfaces and a first coincident surface portion, but contained in turn at least partly in one of said triangular openings, and formed by other portions of said semiconductor material body with said second coincident surface portion also being separated at least partly by said mesh surface portion, said drain interconnection means being electrically in contact with said mesh surface portion, said gate region being located adjacent to said plurality of second substantially coincident surface portions.

65. The device of claim 62 wherein said mesh surface portion is a surface in a groove in said semiconductor material body.

* * * * *